United States Patent [19]

Scheffels

[11] 4,164,640

[45] Aug. 14, 1979

[54] METHOD AND APPARATUS FOR POSITIONING A CHARGED PARTICLE BEAM

[75] Inventor: Wilhelm Scheffels, Puchheim, Fed. Rep. of Germany

[73] Assignee: Steigerwald Strahltechnik GmbH, Munich, Fed. Rep. of Germany

[21] Appl. No.: 820,326

[22] Filed: Jul. 29, 1977

[30] Foreign Application Priority Data

Jul. 30, 1976 [DE] Fed. Rep. of Germany ....... 2634341

[51] Int. Cl.² .............................................. B23K 9/03
[52] U.S. Cl. ..................... 219/121 EM; 219/121 LM
[58] Field of Search ................. 219/121 EB, 121 EM, 219/121 L, 121 LM

[56] References Cited

U.S. PATENT DOCUMENTS

| | | | |
|---|---|---|---|
| 3,300,618 | 1/1967 | Sciaky | 219/121 EB |
| 3,449,542 | 6/1969 | Conner et al. | 219/121 EB |
| 3,743,776 | 7/1973 | Corcelle et al. | 219/121 EB |
| 3,766,355 | 10/1973 | Weserstrasse | 219/121 EB |

FOREIGN PATENT DOCUMENTS

| | | | |
|---|---|---|---|
| 1915459 | 10/1970 | Fed. Rep. of Germany .... | 219/121 EB |
| 1179161 | 1/1970 | United Kingdom .............. | 219/121 EB |

Primary Examiner—J. V. Truhe
Assistant Examiner—Fred E. Bell
Attorney, Agent, or Firm—Brumbaugh, Graves, Donohue & Raymond

[57] ABSTRACT

A method and apparatus for seam welding by means of a charged particle beam is disclosed, wherein any misalignment of the beam with respect to the gap between opposed surfaces of two workpiece parts to be joined is compensated for by a double deflection of the beam. The position of the beam in respect to the gap is determined at two locations spaced in the direction of propagation of the beam, and the deflection in two spaced deflection zones is controlled in response to the result of such determination so that the deflected beam—which may oscillate transversely to the longitudinal direction of the gap—is aligned to the gap and a sound weld seam is produced.

17 Claims, 14 Drawing Figures

METHOD AND APPARATUS FOR POSITIONING A CHARGED PARTICLE BEAM

The present invention relates to a method and a device for positioning a charge carrier beam of an industrial charge carrier beam device with respect to a longitudinal gap between two workpiece parts, more particularly a butt joint between two workpiece parts to be welded together in the charge carrier beam.

In the case of welding thick walled and extensive workpieces with a high beam power without inspection control the following faults can occur as regards the positioning of the focussed charge carrier beam with respect to the butt joint between the workpiece parts to be welded together:

(a) Lateral offset of the beam point of impingement with respect to the butt joint gap owing to distortion of the workpiece and/or owing to remanet magnetic fields magnetic fields remaining in the workpiece; and (b) failure of the direction of the beam to lie in the plane of the butt joint gap, so that the melting zone deep in the workpiece runs out of the butt joint gap, while nevertheless the point of beam impingement at the side, adjacent to the beam gun, of the workpiece is positioned at the butt joint gap.

A further problem can be caused by the breadth of the butt joint gap varying along the seam.

Similar problems occur not only in the case of charge carrier beam welding but also in the case of other charge carrier beam material processing methods as for example in the hardening or other heat treatment of a workpiece in the vicinity of the walls of narrow grooves, between teeth and the like.

One aim of the present invention is that of providing methods and devices, which automatically compensate for the above mentioned faults.

This aim is achieved by a method of the initially mentioned type, which in accordance with the invention is characterised in that the position of the charge carrier beam with respect to the gap is determined at two points spaced apart in the direction of propagation of the charge carrier beam and in that the charge carrier beam is so deflected at two deflection points placed at some distance short of the gap in accordance with the result of the position determination that within the gap the beam has a predetermined course.

A preferred device for positioning a charge carrier beam of an industrial charge carrier beam device, more particularly an electron beam welding device with respect to an elongated gap, more particularly a butt joint to be welded, between two workpieces with an advancing device for producing a relative movement running in the longitudinal direction of the gap, between the charge carrier beam and the workpiece parts forming the gap, a deflecting arrangement by means of which the charge carrier beam can be deflected in a deflection plane running perpendicularly with respect to the gap both dynamically ("oscillating") and also statically ("positioning"), and two sensor arrangements, which respond to electromagnetic radiation, which is emitted by a beam zone of impingment towards the sensor arrangements, is characterised in accordance with the invention that the sensor arrangements are so constructed and arranged that the radiation received respectively by them originates from different parts, spaced in the direction of propagation of the charge carrier beam of the beam zone of impingment and in that the beam control circuit controls two deflecting devices through which the charge carrier beam runs successively and which so deflect the charge carrier beam that it runs in a predetermined direction in the vicinity of the gap.

Further developments and forms of the method and the device in accordance with the invention are defined in the subordinate claims.

The method and the device in accordance with the invention make possible a satisfactory and automatic positioning of the charge carrier beam with respect to the gap and this applies even if unknown and uncontrollable causes apply for improper positioning.

In what follows the problems forming the basis of the invention and specific embodiments of it will be described with reference to the accompanying drawings.

Figures 3, 4A, 4B:
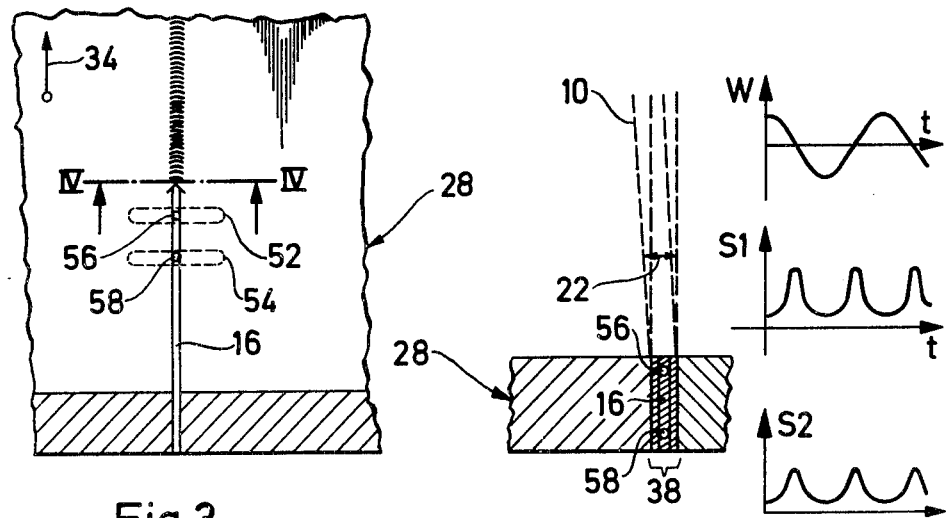
FIG. 3 shows a part view, looking in the direction of the sensor arrangements, of a workpiece.
FIG. 4A shows a sectional view in a plane IV—IV of FIG. 3.
FIG. 4B shows graphs of signals as occur in the device in accordance with FIG. 2 in the case of the circumstances applying as represented in FIG. 4A.

FIGS. 5A and 5B to FIGS. 6A and 6B correspond generally to FIGS. 4A and 4B but show different conditions adjacent to a weld seam.

The figures are not true to scale and furthermoe the various events represented are exaggerated in order to aid clarity.

In what follows the invention will be described with reference to an example of electron beam welding using an electron beam caused to oscillate perpendicularly with respect to the butt joint or weld seam; the invention is however not restricted to this and it can be used both in the case of ion beam welding and also in the case of other electron or ion beam processing methods, such as hardening, other heat treatment of metals, remelting and the like.

Figure 1A:
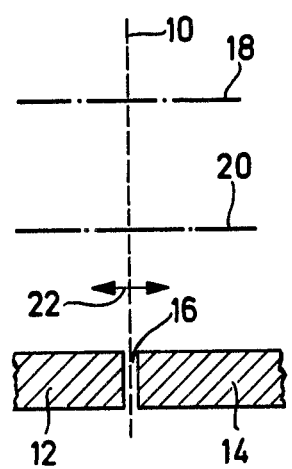
FIGS. 1A to 1F are diagrammatic representations for explaining the problems forming the basis of the invention.

In FIG. 1A a broken line indicates an undeflected electron beam 10 of an electron beam welding device, which is not shown in detail. The beam is used to weld two workpiece parts 12 and 14 together, which form a butt joint gap 16 to be closed by a weld beam. The electron beam 10 can be deflected by means of two deflecting devices, which it passes through successively and which are represented schematically by corresponding deflection planes 18 and 20. In practice the electron beam is periodically deflected perpendicularly to the butt joint gap as is indicated by a double arrow 22, this movement being referred to as oscillating or "wagging". This deflection can for example be brought about in the deflection plane 18 by the associated deflection device, which is not represented.

In the case of the stage represented in FIG. 1A the undeflected electron beam 10 is precisely positioned on the butt joint gap 16, that is to say both on entering the butt joint gap and also on emerging from it, it runs substantially in the center between the frontal sides, forming the butt joint gap, of the workpiece parts 12 and 14. In this case no correction will be required.

Figure 1C:
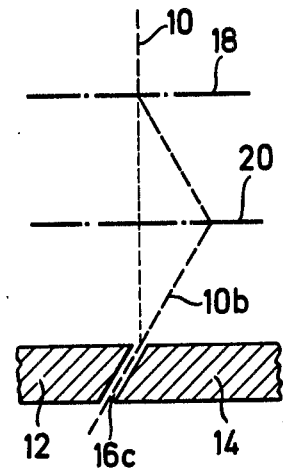
Figure 1B:
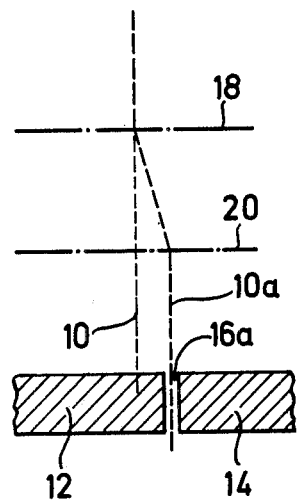

In the stage shown in FIG. 1B the butt joint gap 16 is laterally offset with respect to the undeflected electron beam 10. This offsetting can, as will be explained in more detail below, be compensated for in accordance with the invention by causing the electron beam to be so oppositely deflected in deflection planes 18 and 20 that the deflected electron beam 10a is laterally offset in parallelism by the required amount. The deflected electron beam 10a is then therefore precisely centered on the butt joint gap 16a again.

In the case of the stage shown in FIG. 1C the side, firstly reached by the electron beam 10, of the butt joint gap 16c is admittedly centered with respect to the undeflected electron beam 10, but however the butt joint gap 16c runs obliquely with respect to the direction of propagation of the undeflected electron beam 10, so that the latter would leave the butt joint gap or "seam" at the side which is shown lowermost in FIG. 1C. This fault, as will also be explained presently, is compensated for by the invention by a dual deflection of the electron beam in the deflection planes 18 and 20. Assuming that the distance between the deflection planes 18 and 20 is equal to the distance between the deflection planes 20 and the upper end of the butt joint gap 16, the electron beam will be deflected in the deflection plane 20 oppositely with respect to deflection and deflection plane 18 by an angle, which in amount is equal to twice the deflection angle in the deflection plane 18. The deflected electron beam 10b then runs again precisely centrally with respect to the oblique butt joint gap 16c.

Figure 1D:
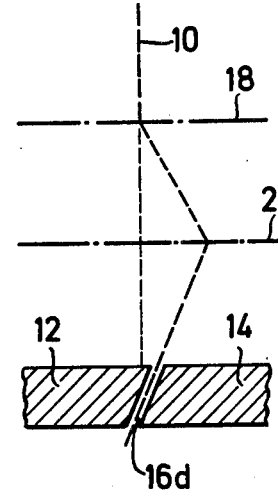

In the case of FIG. 1D the butt joint gap 16d is both oblique and also laterally offset with respect to the non-deflected electron beam 10 and this can also be compensated for by suitable deflection of the electron beam.

Figure 1E:
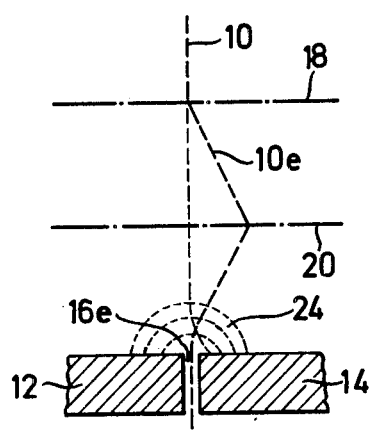
Figure 1F:
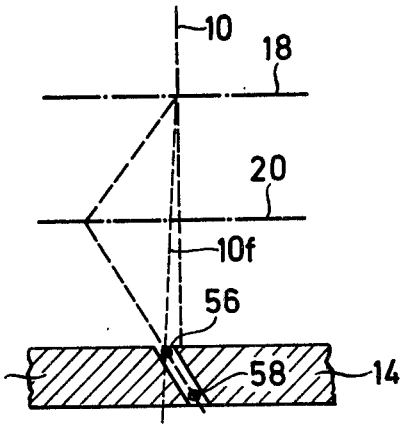

FIG. 1E diagrammatically shows the case in which the butt joint gap 16e is admittedly centered with respect to the axis of the undeflected electron beam 10, but however in the vicinity of the butt joint gap 16e there is an interfering magnetic field 24, by means of which the electron beam 10 is so deflected in an undesired manner that it does not run centrally with respect to the butt joint gap 16e. Such and interfering magnetic field can for example be produced by a remanent magnetisation of the workpiece parts 12 and 14. As is represented in FIG. 1E the undesired deflection, caused by the interfering magnetic field 24, of the electron beam can be compensated for by a corresponding pre-deflection of the electron beam in the deflection planes 18 and 20 so that the deflected electron beam 10e runs substantially centrally with respect to the butt joint gap notwithstanding the interfering magnetic field 24.

Figure 2:
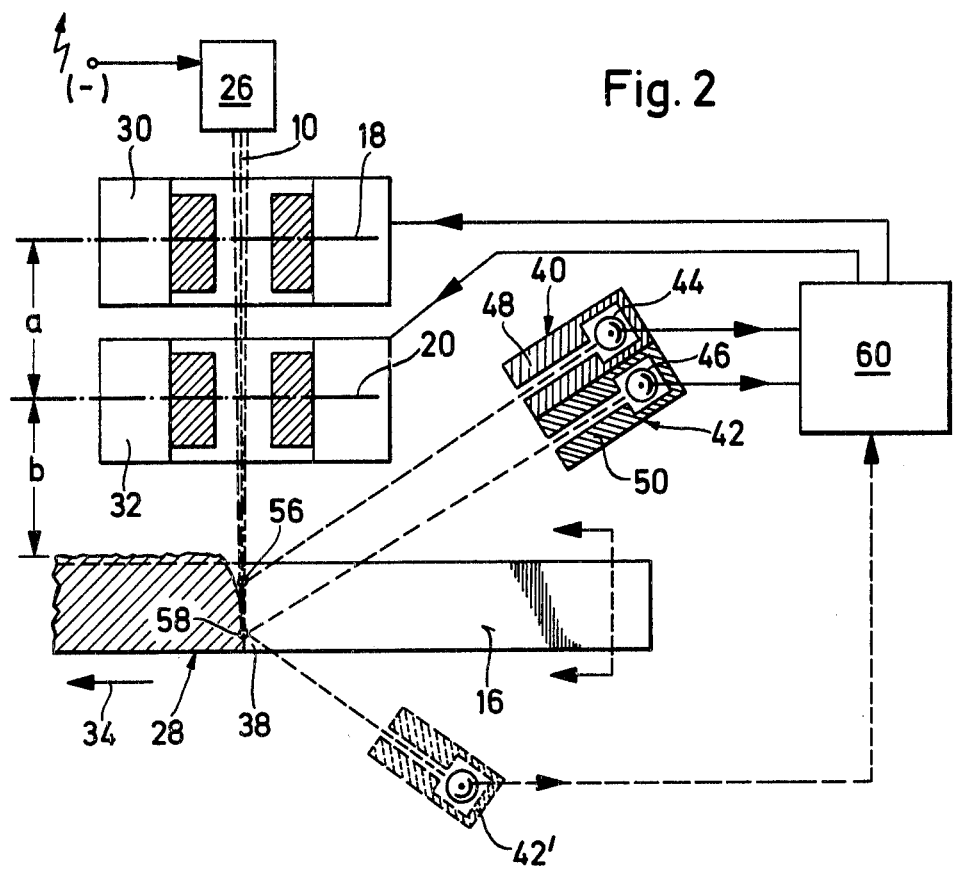
FIG. 2 shows a simplified side view of an electron beam welding device for carrying out the method in accordance with the invention.

FIG. 2 shows in a somewhat simplified manner an electron beam welding device, in the case of which the above described correction measures are carried out automatically. The electron beam welding device comprises a conventional electron gun 26 for producing an electron beam with an energy of for example 150 kV, which can be focussed on the surface of a workpiece 28. The electron beam 10 can be deflected by two deflection devices 30 and 32, which for example can comprise electro-magnets. The idealised deflection planes are represented in FIG. 1 by references 18 and 20 respectively. The distance a between the two deflection planes 18 and 20 is equal to the distance b between the deflection plane 20 and the surface, adjacent to the gun 26, of the workpiece 28. The workpiece can be moved by an advancing device, not shown, in relation to the electron beam 10 and the direction of movement, indicated by an arrow 34, coincides with a butt joint gap 16, which is to be closed by welding of the workpiece 28. The welding can be carried out by supplying additional material, which is introduced in the form of a wire or rod into the weld channel 38.

On the side, which has not yet been welded, of the butt weld gap 16 two sensor arrangements 40 and 42 are arranged, which comprise sensors 44 and 46 responding to electro-magnetic radiation. The sensors can respond to X-rays and are constructed as GEIGER tubes or they can be adapted to respond to ultraviolet, visible or infrared light and consist of vacuum photocells or optoelectronic semi-conductor devices. The sensors 44 and 46 are arranged in screens 48 and respectively 50, which limit access respectively to a narrow, slot-shaped zone 52 and respectively 54 (FIG. 3). The longitudinal direction of the zones 52 and 54 runs transversely with respect to the butt joint gap 16 and the screens 48 and 50 are so aligned or positioned that the sensors 44 and 46 receive radiation from two points 56 and respectively 58, spaced in the direction of propagation of the electron beam 10, on the weld channel 38. Preferably the points or positions 56 and 58 are adjacent to the opposite ends of the weld channel 38, the preferred arrangement being such that the part, which has not yet been welded up, of the butt joint gap 16 acts as a diaphragm or aperture, which restricts the radiation in the lateral direction (that is to say in the longitudinal direction of the gap-shaped zones 52 and 54), as will appear from FIG. 3.

The sensors 44 and 46 are connected with a control circuit 60, which produces control signals for the deflection arrangements 30 and 32 from the output signals of the sensors 44 and 46.

Instead of arranging both sensor arrangements 40 and 42 on the same side of the workpiece, the sensor arrangements can be arranged on different sides of the workpiece, as is indicated by one sensor arrangement 42'.

In the case of the electron beam welding device described the electron beam 10 is periodically deflected (or "oscillated") perpendicularly with respect to the longitudinal direction of the butt joint gap 16, as is indicated in FIG. 4A by the double arrow 22. This can be ensured by a sinusoidal deflecting current W, which can be supplied for example to the deflecting device 30 in a conventional manner.

When the conditions indicated in FIG. 1A obtained and the electron beam 10 runs parallel to the butt joint gap 16 and is centered with respect to it, the resulting weld channel 38 produced is also centered and parallel with respect to the butt joint gap 16, as is represented in FIG. 4A. The sensors 44 and 46 then supply output signals S1 and respectively S2 as are represented in FIG. 4B. These output signals respectively consist of a series of pulses with equal time intervals between them and whose maxima respectively coincide with the zero times of the deflecting current W. Under these conditions the control circuit 60 does not supply any deflection signals to the deflection devices 30 and 32.

Figure 5B:
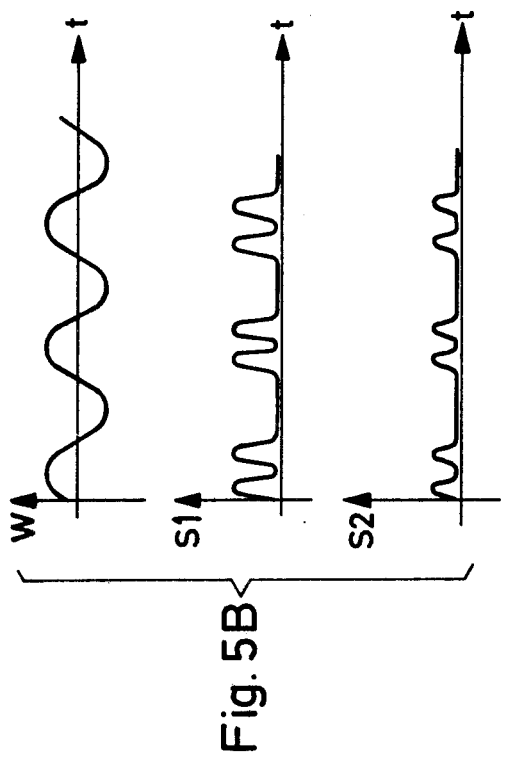
Figure 6B:
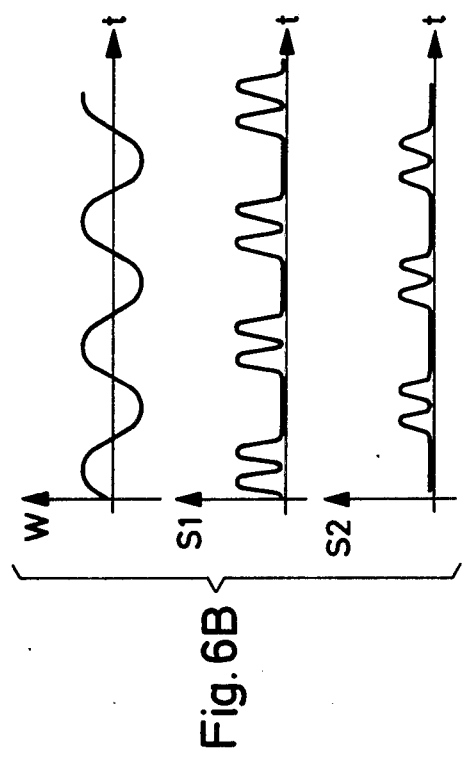
Figure 5A:
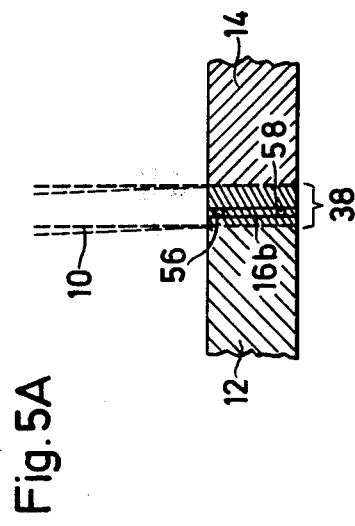

If however, as was explained with reference to FIG. 1B, the undeflected electron beam and accordingly also the average position of the oscillated electron beam is offset laterally with respect to the butt joint gap 16b, the welding channel 38 will also be offset with respect to the butt joint gap 16b, as is represented in FIG. 5A. The sensors 44 and 46 then provide output signals S1 and respectively S2, as represented in FIG. 5B. These output signals are in-phase and consist of pulses, which in an alternating fashion have smaller and respectively larger mutual spacings. The spacing or interval between respectively more adjacent pulses and the phase position of these pulse pairs with respect to the deflection signal W make possible an unambiguous determination of the amount and the direction of the offsetting of the electron beam and therefore compensation of offsetting. Details of how this is carried out will be provided below.

Figure 6A:
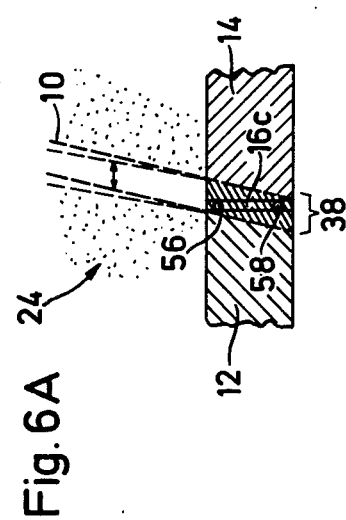

FIG. 6A shows the case, explained with reference to FIG. 1E, in which the oscillated electron beam is so deflected by an interfering magnetic field 24 that it runs obliquely and possibly offset with respect to the butt joint gap 16e. Similar conditions will occur if despite the absence of deflection of the beam 10 the butt joint gap runs obliquely as is represented in FIGS. 1C and 1D. In such cases the weld channel 38 has at the end (the upper end shown in the drawing), adjacent the beam gun, of the butt joint gap a different position with respect to the gap to that at the lower end, remote from the beam gun, of the butt joint gap. The sensors 44 and 46 then supply different output signals, that is to say in the signals S1 and S2 "double pulses" can occur, which in the signals S1 and S2 have different pulse intervals and/or phase relationship with respect to the deflection signal W. Each of the signals S1 and S2 however makes possible in this case as well an unambiguous and quantitative determination of the position of the weld channel with respect to the points 56 and 58 respectively, detected by the respective sensor.

In what follows a few possibilities will be described as regards the production of control signals for the deflecting devices 30 and 32 from the sensor output signals and these deflection devices 30 32 so deflect the electron beam that it runs centrally with respect to the direction of the butt joint gap in parallelism to it.

In the case of the first embodiment of the method the setting or adjustment of the electron beam is carried out in steps.

Firstly the beam position with respect to the measuring point 56 (FIG. 1F) is centered by deflecting the electron beam 10 only in the deflection device 18 with control by the output signal of the sensor 44. The displacement or travel of the deflected beam is denoted by 10f.

Now the beam position is adjusted making use of the output signal of the sensor 46 with respect to the point 58 by deflecting the already deflected electron beam 10f under the control of the output signal of the sensor 46, in the plane 20 in such a manner that it is centered with respect to the measuring point 58; besides the deflection in the deflection plane 20, there is simultaneously an additional deflection in the plane 18, which is opposite and in amount half as large as the deflection in the deflection plane 20. In this method step the deflection current in the two magnetic deflection devices 30 and 32 is simultaneously changed and when the lower deflection device 32 has a current of a pre-determined amount supplied to it, the deflection current of the upper deflection device 30 has subtracted from it an amount of current, which is the opposite in sign and is of half the amount. If this method step leads to a misalignement of the beam with respect to the point 56, the beam position is then brought into alignment again with respect to the point 56 by deflecting the beam in the plane 18 only. Then, if necessary, in the next step the adjustment step, mentioned above as a second step, can be carried out again and so on.

A further possibility of adjustment resides in controlling the beam position with respect to the point 56 by means of the output signal of the sensor 44 and of the deflection device 30 and simultaneously controlling the beam position with respect to the point 58 by means of the output signal sensor 46 and by means of the deflection device 32. An oppositely directed undesired effect on the two adjustment operations and hunting can be avoided by providing the regulation circuit comprising the sensor 44 and the deflection device 30 with a different time constant, for example a time constant, which is shorter by one order of magnitude than the time constant of the regulation circuit comprising the sensor 46 and the deflection device 32. The regulation device comprising the sensor 44 and the deflection device 30 now hold the electron beam centered with a short time constant with respect to the point 56, while the regulation device comprising the sensor 46 and the deflection device 32 cause a follow up, adjusting setting of the beam with respect to the point 58, which is comparatively slow and any resulting misalignement with respect to point 56 will be immediately corrected by the means of "high speed" regulation.

The embodiments of the invention described can be modified in the most various different fashions without leaving the scope of the invention. For example for measuring the beam position it is possible to use, in lieu of the above mentioned electro-magnetic types of radiation, also corpuscular radiation, which is emitted by the weld being formed, as for example electrons, ions or neutral particles such as atoms or molecules (vapour) from the weld zone.

Furthermore the two sensors can be arranged on the side, remote from the beam gun 26 (FIG. 2) of the workpiece. It is also possible to employ two sensors of different types as for example a first sensor responding to stray electrons and a second sensor responsive to X-rays. This measure will in some circumstances facilitate drawing a distinction between the radiation originating from the two different measuring points 56 and 58 (FIG. 4A) and can be particularly appropriate if the sensors are located on different sides of the workpiece.

Furthermore it is within the scope of the present invention to use a signal minimum to determine the beam position, in lieu of a signal maximum as was explained for example in conjunction with FIGS. 4A and 4B. A signal minimum can for example occur when the measuring point 56 (see FIG. 4A) is in the immediate vicinity of the surface of the workpieces and the associated sensor 40 (FIG. 2) responds to the stray electrons for the workpiece surface.

I claim:

1. A method for aligning a charge carrier beam of an industrial charge carrier beam device with respect to an elongated gap between two workpiece parts, characterised in that the position of the charge carrier beam with respect to the gap is determined at two positions, which are spaced in the direction of propagation of the charge carrier beam and in that the charge carrier beam is then deflected in accordance with the result of the position determination at two deflection positions placed at some distant short of the gap in the direction of propagation in such a manner that it has a pre-determined course with the gap.

2. A method in accordance with claim 1 in the case of which the charge carrier beam is periodically oscillated transversely with respect to the gap, characterised in that the charge carrier beam is so deflected at the deflection positions that it runs parallel with respect to the gap and centered in relation to it.

3. A method in accordance with claim 1 characterised in that the position of the charge carrier beam is determined with respect to the gap with the help of photon radiation, which originates from the interior of the gap.

4. A method in accordance with claim 1 characterised in that the beam is set in position in pre-determined time intervals by deflection in one of the deflection position, which it runs through with respect to the first measurement position reached by it and in that the beam during other time intervals, which alternate with the first mentioned intervals, is adjusted with respect to the other measuring position by being deflected at the other deflection position by a corresponding amount and is deflected in a certain direction and simultaneously at the first deflection position in the opposite direction and by half the respective amount.

5. A method in accordance with claim 1 characterised in that the electron beam is adjusted with the help of a first signal, which is obtained from the first measurement position it reaches, at one of the deflection position it passes through with a pre-determined time constant with respect to the first measurement position and in that the beam is adjusted furthermore by deflection at the other deflection position under control of a signal, obtained from the second measurement position, with a time constant, which substantially differs from the first mentioned time constant, with respect to the second measurement position.

6. A method in accordance with claim 5, characterised in that the second time constant amounts to at least three times and preferably five or ten times the first time constant.

7. An industrial charge carrier beam device, comprising an advance device for producing a relative movement running in the longitudinal direction of a gap, between a charge carrier beam and two workpiece parts forming the gap, a deflection arrangement by means of which the charge carrier beam can be deflected in a deflection plane, running transversely with respect to the gap, both periodically and also statically, and two sensor arrangements, which respond to radiation emitted at a beam impingment zone of the workpiece parts towards the sensor arrangements, characterised in that the sensor arrangements are so constructed and arranged that the radiation, which is respectively received by them originates from different positions, spaced in the direction of propagation of the charge carrier beam, of the beam impingment zone and in that the output signals of the sensor arrangement are supplied to a beam control circuit, which so controls two deflection devices through which the charge carrier beam runs successively, of the deflection arrangement that the deflected charge carrier beam has a pre-determined course in the vicinity of the gap.

8. A means in accordance with claim 7, characterised in the sensor arrangements respectively comprise a screen, which limits access to them to a slot shaped zone.

9. A means in accordance with claim 7, characterised in that at least one of the sensor arrangements is so arranged that the radiation detected by it originates from the interior of the gap.

10. A means in accordance with claim 7, characterised in that the beam control circuit controls the beam position with respect to the two measurement positions detected by the sensor arrangements in a temporaly alternating manner.

11. A means in accordance with claim 7, characterised in that each sensor arrangement controls one and only one deflecting device.

12. A means in accordance with claim 11, characterised in that the sensor arrangements with the associated deflection devices from regulation circuits with different regulation time constants.

13. A method in accordance with claim 1, characterised in that the position of the charge carrier beam with respect to the gap is determined with the help of corpuscular radiation.

14. A method in accordance with claim 3, characterised in that the position of the charge carrier beam with respect to the gap is determined at least at one of the positions with the help of radiation originating from the interior of the gap.

15. A means in accordance with claim 7, characterised in that the two sensor arrangements are arranged on the same side of the workpiece parts.

16. A means in accordance with claim 7, characterised in that the sensor arrangements are arranged on different sides of the workpiece parts.

17. A method in accordance with claim 13 characterized in that the position of the charged carrier beam with respect to the gap is determined at least at one of the positions with the help of radiation originating from the interior of the gap.

* * * * *